(12) United States Patent
Quinn (10) Patent No.: US 6,642,751 B1
(45) Date of Patent: Nov. 4, 2003

(54) CONFIGURABLE TRACK-AND-HOLD CIRCUIT

(75) Inventor: Patrick J. Quinn, Dublin (IE)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/236,668

(22) Filed: Sep. 6, 2002

(51) Int. Cl.[7] .............................................. G11C 27/02
(52) U.S. Cl. ............................ 327/94; 327/95; 327/337
(58) Field of Search .............................. 327/91, 93, 94, 327/95, 96, 337; 341/122

(56) References Cited

U.S. PATENT DOCUMENTS 5,142,236 A * 8/1992 Maloberti et al. .......... 327/337
6,215,337 B1 * 4/2001 Bazarjani ..................... 327/91

* cited by examiner

Primary Examiner—Terry D. Cunningham
Assistant Examiner—Long Nguyen
(74) Attorney, Agent, or Firm—LeRoy D. Maunu (57) ABSTRACT

A track-and-hold circuit including a pair of circuits each receiving input signals and providing half of a differential output signal. Each of the circuits of the pair includes an amplifier, and a configurable switch circuit coupled to a selectable reference voltages based on an expected input signal type. Each circuit includes a first switched capacitor circuit to sample its respective first input signal in response to a first clock phase, and to couple the sampled first input signal between the output and the negative input of the amplifier in response to a second clock phase. A second switched capacitor circuit samples its respective second input signal relative to an external common mode voltage in response to the first clock phase, and couples the sampled second input signal to a positive amplifier input relative to the selected reference voltage in response to the second clock phase. The amplifiers collectively provide a differential version of the difference between the sampled input signals as shifted by the selected reference voltage.

33 Claims, 6 Drawing Sheets

CONFIGURABLE TRACK-AND-HOLD CIRCUIT

FIELD OF THE INVENTION

The present invention generally relates to track-and-hold and/or sample-and-hold circuits, and more particularly to an apparatus for providing accurate track and hold functionality for a number of different input signal types.

BACKGROUND

Track-and-hold (T&H) circuits, and the more general sample-and-hold (S&H) circuits, are used in a variety of applications, such as analog-to-digital converters (ADCS) and switched capacitor filters. A conventional T&H circuit in its simplest sense includes a switch and a capacitor to first "track" the input signal, and to subsequently "hold" the input signal for processing. The most prevalent use of T&H circuits is as a front-end for ADCS. A T&H circuit receives analog continuous-time signals, and converts them to analog sampled data signals. These analog sampled data signals can then be processed, for example, by an ADC to ultimately provide a digital representation of the original analog continuous-time signal.

A variety of different input signal types may represent the analog continuous-time signal that is to be sampled, held, and ultimately processed. For example, a single-ended signal source, such as a voltage signal across a resistance or other impedance, may provide a unipolar signal where a first input signal (e.g., $V_P$) is always greater than or equal to a second input signal (e.g., $V_N$) Track-and-hold circuits exist to sample and hold such unipolar signals. Different circuit architectures exist to accommodate bipolar signals, such as where the signal source is derived from a bridge or other circuit arrangement where $V_P$ can be greater than or less than $V_N$. Still other circuit designs can accommodate differential input signals.

However, current T&H technology is geared to the particular type of input signal that is to be provided. Different circuits are therefore required to track/hold continuous-time signals from a like number of different input signal types. These existing circuits are inflexible in terms of dealing with different types of input signals.

The present invention addresses these and other shortcomings of the prior art, and provides a solution to the problems exhibited by prior art T&H and S&H circuits.

SUMMARY OF THE INVENTION

In various embodiments, the present invention provides an accurate and highly versatile track-and-hold/sample-and-hold circuit capable of operating with a plurality of different types of input signals.

In accordance with one embodiment of the invention, a track-and-hold circuit is provided that includes a pair of circuits each receiving first and second input signals and providing half of a differential output signal. The first and second input signals received by each respective circuit are reversed relative to each other, i.e., where the first circuit respectively receives InP and InN at first and second inputs, the second circuit respectively receives InN and InP at the corresponding inputs. Each of the circuits of the circuit pair includes an amplifier, and a configurable switch circuit coupled to a selected one of a plurality of selectable reference voltages based on an expected input signal type. Each circuit includes a first switched capacitor circuit to sample its respective first input signal relative to a common mode voltage in response to a first clock phase, and to couple the sampled first input signal in a feedback configuration between an output and a negative input of the amplifier in response to a second clock phase. Each circuit further includes a second switched capacitor circuit to sample its respective second input signal relative to the common mode voltage in response to the first clock phase, and to couple the sampled second input signal to a positive input of the amplifier relative to the selected one of the selectable reference voltages in response to the second clock phase. In this manner, the amplifiers of the circuit pair collectively provide the differential output signal as a differential version of the difference between the sampled first and second input signals as shifted by the selected one of the selectable reference voltages. The circuit is operational with a variety of different input signal types, including unipolar signals, bipolar signals, and differential input signals.

It will be appreciated that various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

In the following description of the exemplary embodiment, reference is made to the accompanying drawings which form a part hereof, and in which is shown by way of illustration various manners in which the invention may be practiced. It is to be understood that other embodiments may be utilized, as structural and operational changes may be made without departing from the scope of the present invention.

The present invention is directed to a versatile track-and-hold circuit that allows for single-ended to fully differential conversion, and processing of various types of input signals including bipolar signals, unipolar signals, and fully differential signals. The analog input signal is accurately sampled, level shifted such that it is placed between two reference levels, and held at the output for further processing by a subsequent circuit such as an ADC.

Track-and-hold (T&H) circuits, and the more general sample-and-hold (S&H) circuits, are used in a variety of applications, such as analog-to-digital converters (ADCs) and switched capacitor filters. A conventional T&H circuit in its simplest sense includes a switch and a capacitor to first "track" the input signal, and to subsequently "hold" the input signal for processing. For example, when the switch is on, the output voltage $V_{out}$ of the T&H circuit will follow or "track" the input voltage $V_{in}$. When the switch is off, $V_{out}$ remains relatively constant. Therefore, the circuit tracks the signal when the switch is on, and holds the instantaneous value of $V_{in}$ across the capacitor when the switch is turned off.

Currently, the widest application of T&H circuits is as a front-end for analog-to-digital converters (ADCs). The T&H serves as the interface between the analog input pin and the ADC input—converting analog continuous-time signals to analog sampled data signals (continuous-amplitude and discrete-time). There are two broad ranges of applications for ADCs, namely system monitoring and communications. In system monitoring, accuracy is usually the most important criterion rather than speed, as integral non-linearity (INL), differential non-linearity (DNL), offset, and gain errors need to be low—typically at 12-bits or higher for high quality applications. Absolute measurements need to be made of power supply voltages, supply currents, temperature, peak and trough detection, etc. On the other hand, for communications applications, absolute accuracy is less important so that, for instance, offset, DNL, and gain errors are not so important. INL is equally important since it is representative of the distortion produced by the ADC. Speed, noise, and distortion are the main criteria for judging communications ADCs.

Most T&Hs are intended purely for high speed (communications) applications with the pure intention of attempting to capture accurate samples of the analog input waveform at regular sample intervals determined by the sample clock (of period T). Such T&Hs are normally not very versatile in terms of functionality, making it difficult to combine high performance with different modes of sampling operation such as needed in system monitoring applications. A single T&H architecture that can be equally applied to system monitoring as well as communications applications is not achievable using prior art solutions. The present invention provides a solution to this problem, allowing for a single T&H to be used with all modes of operation of an ADC.

Figure 1A:
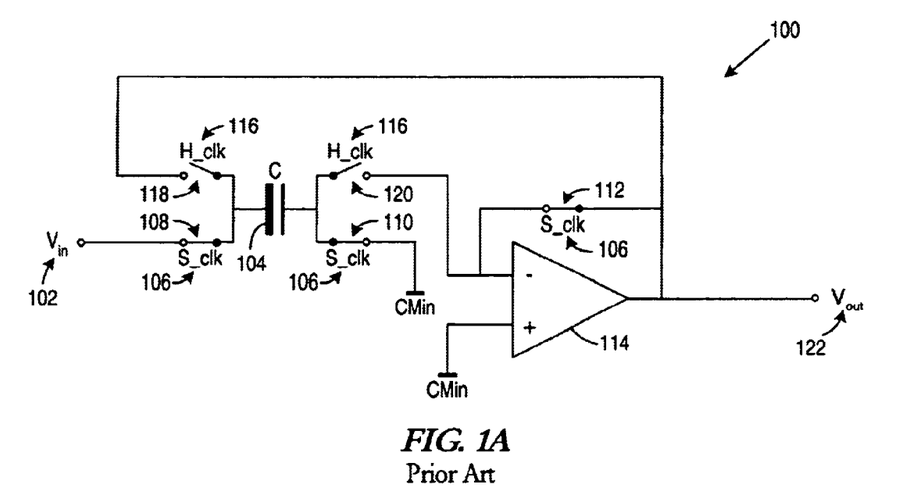
FIG. 1A is a block diagram of one example of a single-ended sample-and-hold circuit.

FIG. 1A is a block diagram of one example of a single-ended S&H 100. The input, $V_{in}$ 102, is sampled onto the capacitor C 104 when the sample clock S_clk 106 is high, as a result of switches 108 and 110 closing. At the same time, a switch 112 is closed around the amplifier 114 to keep it operating closed loop. When the hold clock H_clk 116 is high and switches 118, 120 close, the sampled signal is presented at the negative input of the amplifier 114 to provide the $V_{out}$ 122 signal.

Figure 1B:
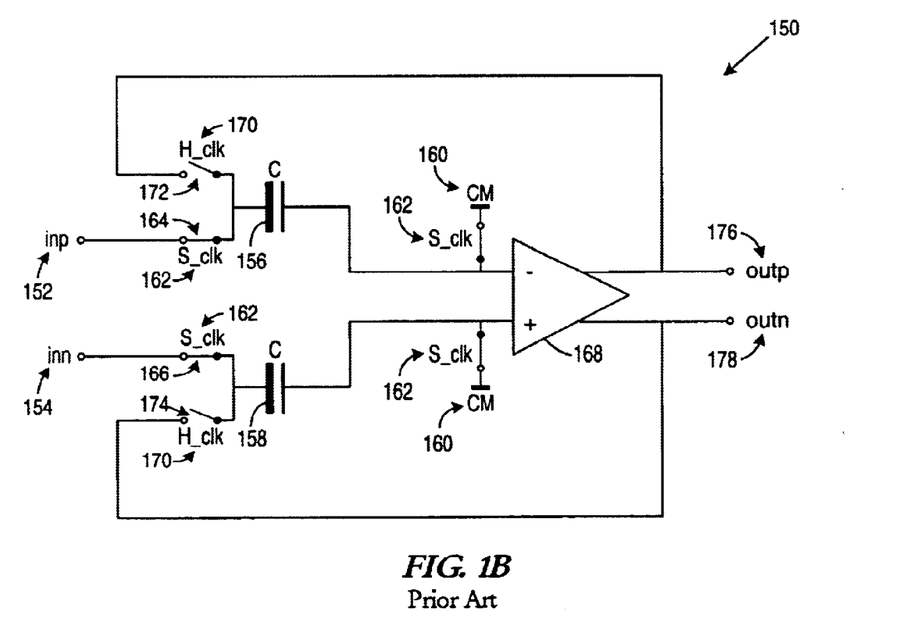
FIG. 1B is a block diagram of an example of a differential sample-and-hold circuit.

FIG. 1B is a block diagram of an example of a differential S&H 150. This "flip-around" S&H 150 samples the differential input signal including the inp 152 and inn 154 signals onto the capacitors 156, 158 with respect to common-mode (CM) 160 when the sample clock S_clk 162 is high causing switches 164, 166 to close. These capacitors are then flipped around to be placed over the amplifier 168 between their outputs and inputs when the H_clk 170 goes high causing switches 172, 174 to close. The differential output signal, including outp 176 and outn 178, is thus provided.

The examples of FIGS. 1A and 1B have the advantages of high speed and producing outputs that are relatively independent of capacitor mismatch. However, they are inflexible in terms of dealing with the aforementioned types of input signals typically occurring in measurement ADC-type applications. The circuits of FIGS. 1A and 1B can handle and deliver at their outputs only single-ended or fully differential analog signals respectively. A further point with respect to FIG. 1A is that the circuit is asymmetrical in that the impedances and circuit conditions seen at both inputs of the amplifier are different, which results in added distortion.

The present invention, on the other hand, is a highly versatile track-and-hold (T&H) that can be used in either system monitor or high frequency signal processing applications. It combines the functions of single-ended to fully differential conversion, processing bipolar signals, processing unipolar signals, and processing fully differential signals. The end circuit, such as an ADC, needs no knowledge of the type of analog input signal received, since it always receives a fully differential signal from the T&H which is set at the appropriate common-mode level for it to sample optimally.

Using the circuit of the present invention, the analog input signal is accurately sampled, level shifted to be placed between predetermined reference levels, and held at the output for further processing by, for example, an ADC. The circuit is such that all the various modes of operation of an ADC can be determined purely by the characteristics of the T&H. The subsequent ADC operates in exactly the same way, irrespective of the type of analog input signal received. No common-mode feedback circuit is required. The solution is compact and requires only a single transfer between input and output. The accuracy of the T&H function is independent of the matching accuracy and linearity of the signal processing capacitors used. The circuit can be implemented in the most current CMOS processes without prior knowledge of the full analog characteristics or matching accuracies of the process components, which provides a significant advantage over prior art T&H and sample-and-hold (S&H) circuits.

It should be recognized that while the various embodiments of the invention are generally described in terms of T&H circuits, the principles of the present invention are equally applicable to the more general sample-and-hold circuits. In general terms, a primary difference between a T&H and an S&H is that the T&H spends most of its time in the sample mode following/tracking the input signal, while the S&H generally spends at least the same amount of time (often more) in the hold mode relative to the sample mode. This is largely due to the fact that the T&H normally connects to an input pin of an integrated circuit chip to which a relatively large amount of capacitance is attached. The T&H generally needs to be settled out in the sample mode before a final definitive sample is taken. The quality of the sampling is determined by the aperture delay and jitter. In any event, while the description below is described in terms of T&H circuits, the present invention is equally applicable to T&H and S&H circuits.

Figure 2:
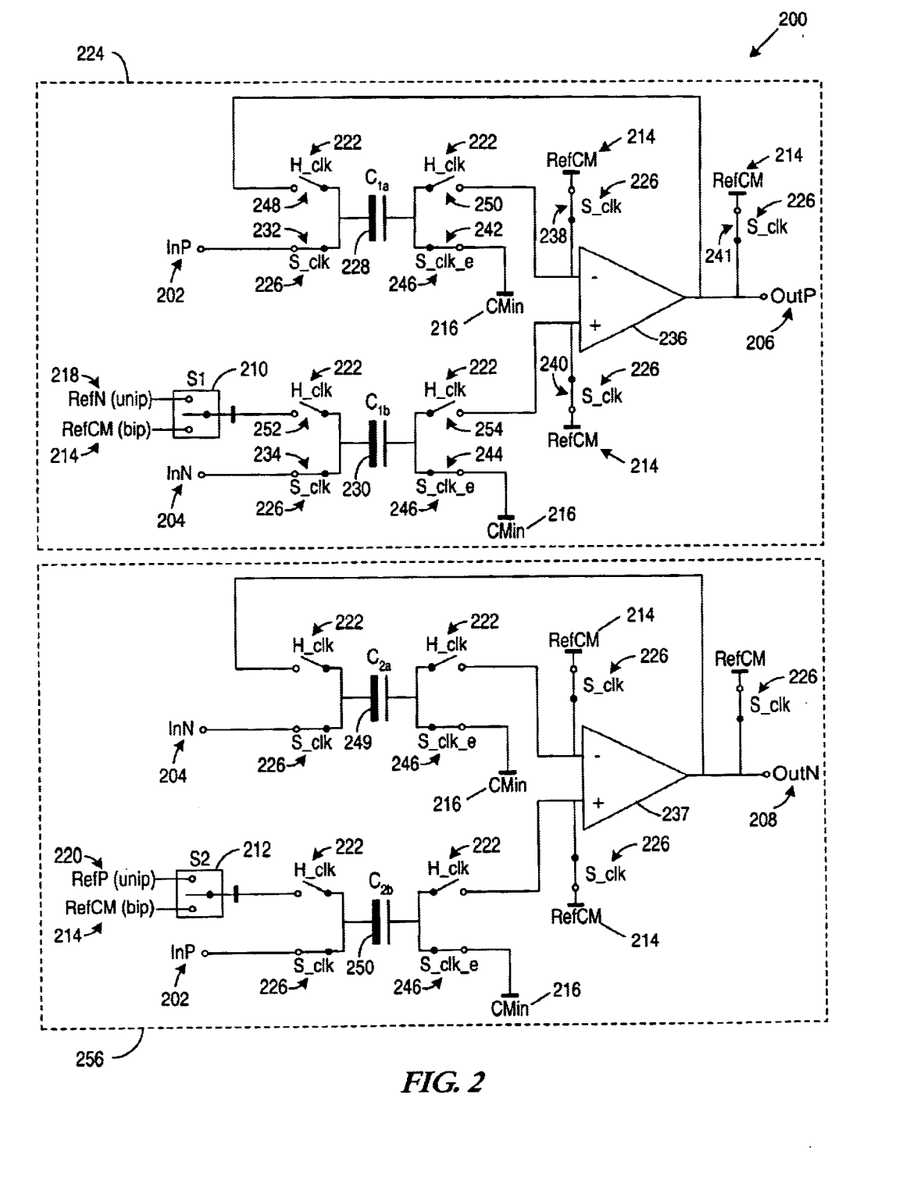
FIG. 2 is a diagram illustrating a representative embodiment of a track-and-hold circuit in accordance with the principles of the present invention.

As indicated above, the present invention facilitates combining a number of possible modes of operation of an ADC into a single circuit block. FIG. 2 is a diagram illustrating a representative embodiment of a track-and-hold circuit 200 in accordance with the principles of the present invention. The T&H circuit 200 provides a fully differential version of InP 202 minus InN 204 (at the moment of sampling) between the output terminals providing the OutP 206 and OutN 208 signals. The input signals InP 202 and InN 204 may be single-ended and totally independent of each other, or may collectively represent a differential input signal. The T&H circuit 200 can be configured in either a bipolar or unipolar mode to process bipolar or unipolar signals respectively.

Configuration switches S1 210 and S2 212 determine the mode of operation. The switches 210 and 212 illustrated in FIG. 2 represent switching functions, as any number of switching implementations may be used. In the illustrated embodiment, there are two common-mode voltages: RefCM 214 and CMin 216. In this embodiment, CMin 216 is an external common-mode voltage, while RefCM 214 is an internal common-mode voltage set at approximately the midpoint between RefN 218 and RefP 220, i.e., (RefP+RefN)/2. CMin 216 changes depending on whether the circuit 200 is to operate in bipolar or unipolar mode. Selection of RefP and RefN depends on the particular application in which the T&H is to be used, where the difference between RefP and RefN defines the maximum peak-to-peak voltage to be presented at the circuit receiving the differential output from the T&H. For example, selection of RefP and RefN are internal choices that may be made to maximize the dynamic range of, for example, an ADC.

As indicated above, switches S1 210 and S2 212 determine the mode of operation. If the T&H circuit 200 is to receive unipolar input signals, the switching functions represented by switches S1 210 and S2 212 are configured to be coupled to RefN 218 and RefP 220 respectively. If the T&H circuit 200 is to receive bipolar input signals, the switching functions represented by switches S1 210 and S2 212 are configured to be coupled to RefCM 214. In one embodiment of the invention, this switching function may be configured via a programmable configuration register. In such a case, the programmable configuration register is loaded with a value indicative of whether RefN/RefP or RefCM will be coupled to the T&H circuit 200. Such a register may be loaded upon initialization of the circuit, and/or subsequently modified by a user.

In bipolar mode the voltage signal in InP 202 can be greater than or less than the voltage on InN 204. The signals on InP 202 and InN 204 can be unrelated AC signals with different DC levels, or can be a differential input signal. InP 202 and InN 204 can vary anywhere, independently from each other, between 0V and RefP, as long as the following condition is met:

$$Abs[InP-InN] \leq (RefP-RefN)/2.$$

The T&H circuit 200 can perform differential measurements of one input with respect to the other. In bipolar mode, both S1 210 and S2 212 switch with the hold clock (H_clk 222) to a predetermined common-mode reference voltage RefCM 214. Further, in one embodiment, CMin 216 is chosen as approximately half the maximum expected swing at the output of the T&H, i.e., (RefP−RefN)/2. For instance, if RefP 220 is chosen as 1.5V and RefN 218 is chosen as 0.5V, then CMin 216 is preferably-chosen as 0.5V in bipolar mode for maximum usable signal range.

Figure 3:
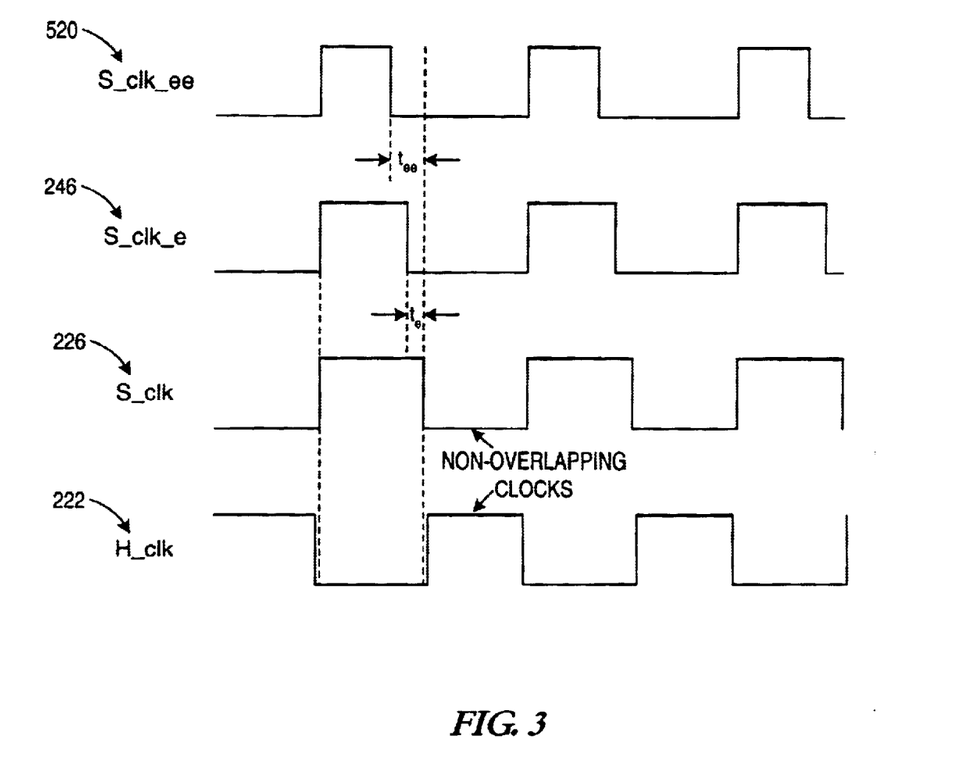
FIG. 3 is a waveform diagram illustrating an exemplary embodiment of various clock signals used to effect track and hold functions in accordance with the present invention.

First consider the top half 224 of the T&H circuit 200. At least two clock phases are used in the T&H circuit 200, including the non-overlapping sample clock S_clk 226 and the hold clock H_clk 222. An example of such clock phases are shown in FIG. 3. Referring briefly to FIG. 3, and using the same reference numbers as those in FIG. 2, the S_clk 226 and H_clk 222 represent non-overlapping, different phases of a two-phase clock signal 180 degrees out of phase from one another. The signals are preferably made to be non-overlapping with respect to one another to provide a time when all clocks are at a low logic level to avoid shorting.

Returning to FIG. 2, when the S_clk 226 signal is at a predetermined logic level (assume a high logic level for purposes of this description), InP 202 is sampled across the capacitor $C_{1a}$ 228 with respect to CMin 216. Similarly, InN 204 is sampled across $C_{1b}$ 230 with respect to CMin 216. This is accomplished by closing switches 232, 234 in response to the S_clk 226 signal. Again, for purposes of this description, it is assumed that when the referenced clock signals/phases are high, the corresponding switch will be on/closed. The capacitors may be discrete capacitors, as well as other circuit structures exhibiting a desired amount of capacitance. Also, in one embodiment, the inputs and output of the amplifier 236 are reset to RefCM 214 by closing switches 238, 240, 241 on the high state of S_clk 226.

In one embodiment, the switches 242, 244 connected to CMin 216 are switched off before all the other switches. This is accomplished by switching switches 242, 244 using a clock signal, S_clk_e 246, that has a falling edge that slightly leads the falling edge of the S_clk 226. An example of the S_clk_e 246 signal is shown in FIG. 3, where the S_clk_e 246 transitions to a low logic level prior to the S_clk 226 transitioning to a low logic level by a time $t_e$. This ensures clean, non-signal dependent sampling. Furthermore, the input switches 232, 234 of FIG. 2 that are respectively connected to InP 202 and InN 204 tend to be large in order to ensure a small resistance with low dependency on the signal level. By switching off the switches 242, 244 connected to CMin 216 first, a high impedance path is created through the signal capacitors $C_{1a}$ 228 and $C_{1b}$ 230. In this manner, most of the charge of the large input switches 232, 234 returns to the relatively low impedance signal source.

On the following period, when the H_clk 222 is high and switches 248, 250 close, $C_{1a}$ 228 is placed across the amplifier 236 such that the difference between InP 202 and RefCM 214 appears between OutP 206 and the negative input terminal of the amplifier 236. At substantially the same time, $C_{1b}$ 230 is switched via switch 252 such that the side of $C_{1b}$ 230 that was connected to InN 204 during sampling is connected to RefCM 214 via S1 210. Further, the other side of $C_{1b}$ 230 that was connected to RefCM 214 via switch 240 is now connected to the positive input terminal of the amplifier 236 due to switch 254 closing. When this occurs, the circuit essentially strips off the CMin 216, and replaces it with the RefCM 214 which is the common mode reference for the internal circuitry of the subsequent circuit (e.g., ADC). The net effect at the output terminal is to create an output voltage OutP 206 at the end of the H_clk 222 period (T) which is the difference between InP 202 and InN 204 at the moment of sampling (defined as when S_clk_e 246 transitions from high to low). RefCM is selected in advance to define where the signal will be centered at the output.

The bottom half 256 of the T&H circuit 200 operates in a similar manner as the top half 224, except that InN 204 and InP 202 are reversed. In this way, a fully differential version of InP 202 minus InN 204 (at the moment of sampling) is created between the output terminals with the OutP 206 and OutN 208 signals. In one example where RefP 220 is chosen as 1.5V and RefN 218 is chosen as 0.5V, the voltages on InP 202 or InN 204 can vary anywhere between 0V and 1.5× (RefP−RefN), and can be totally independent of one another.

An ADC coupled to the T&H circuit 200 can also sample fully differential input signals in bipolar mode and process them such that they are placed neatly between RefP and RefN for further processing by a fully differential ADC. Thus the T&H 200 can be used in signal processing applications and can also be used to subsample radio frequency (RF) signals to be processed at a lower speed in the ADC.

As indicated above, the T&H circuit 200 can also operate in unipolar mode. In unipolar mode, switch S1 210 connects to RefN 218 during the hold time when H_clk 222 is high, while S2 212 connects to RefP 220. Further, CMin 216 is chosen as 0V in one embodiment so that both InP 202 and InN 204 are sampled directly with respect to ground. For unipolar mode, the voltage on InP 202 is equal or greater than the voltage on InN 204. InN 204 is generally a common reference voltage to which InP 202 is also referred. This can be, for instance, a noisy ground or reference plane whose noise is also added to the desired signal on InP 202. The voltage on InP 202 represents, therefore, the desired signal voltage with the additive unwanted noise.

Again considering the top half 224 of the T&H circuit 200, InP 202 is sampled across the capacitor $C_{1a}$ 228 with respect to ground (~0V) when S_clk 226 and S_clk_e 246 are high. Similarly, InN 204 is sampled across $C_{1b}$ 230 with respect to ground when S_clk 226 and S_clk_e 246 are high. This is accomplished by closing switches 232, 234, 242, 244 in response to the S_clk 226 and S_clk_e 246 signals. The amplifier 236 external nodes are again set to RefCM 214 on the S_clk 226 via switches 238, 240, 241. The sampling sequencing/timing is the same as was described for the bipolar mode.

On the following phase when H_clk 222 is high, $C_{1a}$ 228 is placed across the amplifier 236 such that a potential exists, between OutP 206 and the negative input terminal of the amplifier 236, of the full value of InP 202 with respect to ground at the sampling instant (the instant when S_clk_e 246 transitions from high to low). At substantially the same time, $C_{1b}$ 230 is switched such that the side of $C_{1b}$ 230 that was connected to InN 204 during sampling is now connected to RefN 218 during the hold time. Further, the other side of the capacitor $C_{1b}$ 230 is connected to the positive input of the amplifier 236. The net effect is to create a voltage at OutP 206 that is equal to InP 202 at the sampling instant from which the common unwanted voltage InN 204 has been stripped off.

The maximum voltage that can appear on InP 202 is the full value of RefP 220 while the maximum voltage that can appear on InN 204 is RefN 218. The maximum difference voltage is therefore RefP–RefN, which is the full signal handling capability of the succeeding ADC in the extreme case, with, for example, RefP–RefN set at 1V and RefN set at 0.5V, then 1.5V appears across $C_{1a}$ 228 while the negative terminal of the amplifier is brought down to 0V. Hence, OutP 206 is +1V with respect to RefN 218. It should be recognized that these voltage values are provided for purposes of explanation, and other voltage levels for RefP and RefN may analogously be used.

Circuit operation is substantially the same for the bottom half 256 of the T&H circuit 200, except that $C_{2b}$ 250 now switches with respect to RefP 220. Therefore, the bottom half of the circuit can also swing through the maximum signal range of RefP–RefN, but in anti-phase. In this way, again, a fully differential version of InP 202 with the common signal InN 204 removed appears between the output terminals OutP 206 and OutN 208., Effectively a single-ended to fully differential conversion of the desired input signal has occurred, and it is also shifted and been placed neatly between RefP 220 and RefN 218. The output signal (OutP, OutN) can be further processed in a subsequent ADC as a fully differential signal.

Further general features of the T&H circuit of the present invention include that it is very fast and always produces a fully differential sampled and held output signal, irrespective of whether the input is single-ended, differential, or fully differential. The circuit 200 is fully symmetrical in all respects for all modes of operation, providing a very high quality output signal, in spite of noise and interference on power supplies, substrate, etc. There is only a single transfer between input and output, reducing noise compared to conventional circuits that require multiple transfers to achieve the same output result as for the T&H circuit of the present invention. The capacitors do not require exact matching to achieve an accurate transfer, and thus the circuit can be integrated in the very latest CMOS technology without analog options or analog characterization.

The representative circuit of FIG. 2 can also be realized in a double sampling implementation. Such a double sampling implementation may be realized by sampling the inputs on a first clock phase and delivering its output on a second clock phase, while also sampling the inputs on the second clock phase and delivering its output on the first clock phase through the use of an additional set of capacitors and associated switch circuitry. By doubling the capacitors and associated circuitry in this manner, the inputs can be processed at double the rate of a single-sampling implementation, thereby doubling the processing speed of the circuit coupled to the output of the double sampling T&H .(e.g., an ADC). For high quality applications, reset switches may be again used on the inputs and outputs of the amplifiers, similar to the reset switches 238, 240, and 241 shown in the top half 224 of the T&H circuit 200 of FIG. 2.

Figure 4:
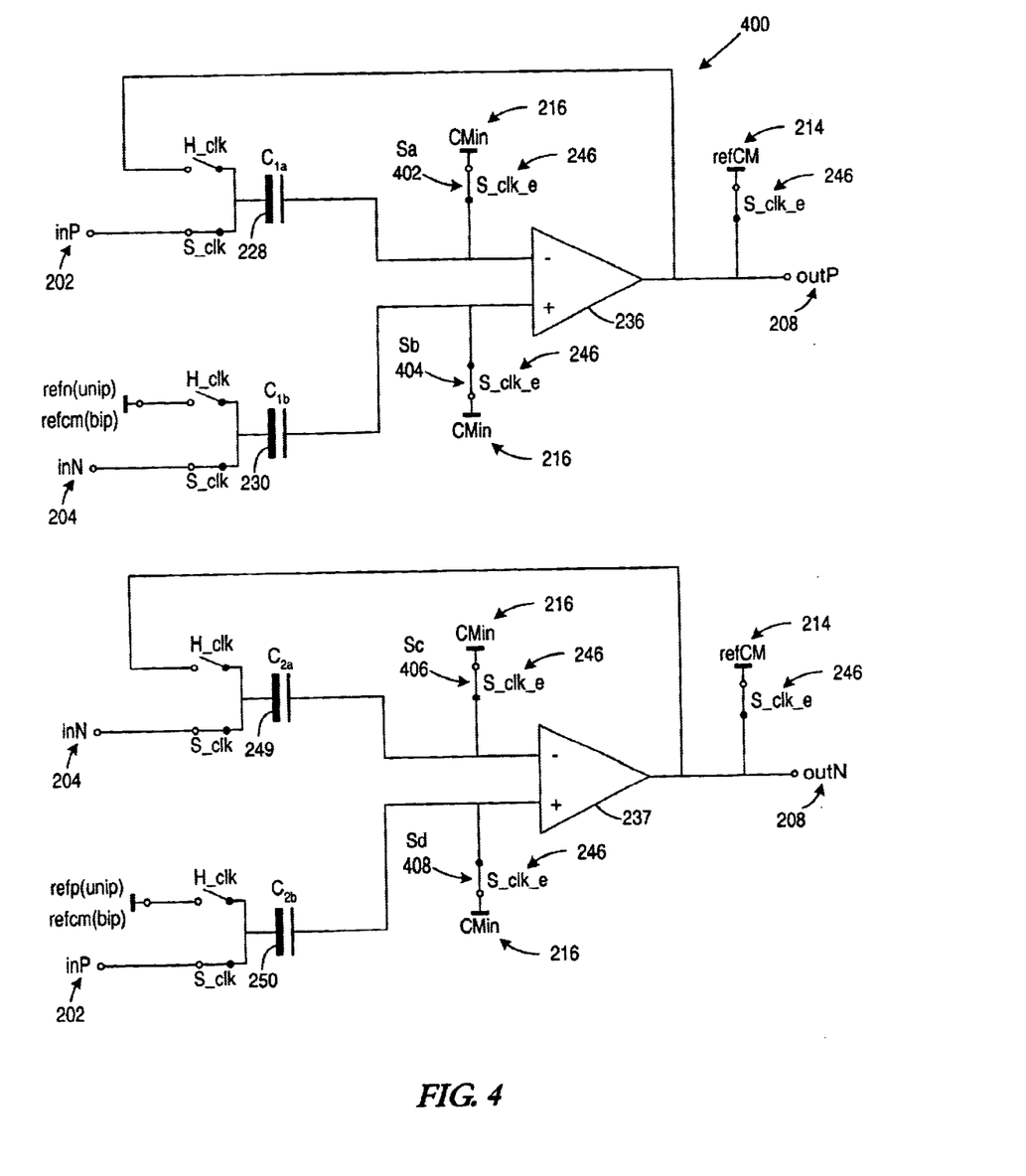
FIGS. 4 and 5 illustrate other representative embodiments of track-and-hold circuits in accordance with the principles of the present invention.

FIG. 4 is a diagram illustrating another embodiment of a track-and-hold circuit 400 in accordance with the principles of the present invention. The embodiment of FIG. 4 differs from that of FIG. 2 in that the two switches between each of the capacitors and the amplifier are removed. More particularly, for the embodiment illustrated in FIG. 4, the switches 242, 244, 250, and 254 shown in the top portion 224 of the T&H circuit 200 of FIG. 2 are removed, as are the corresponding switches of the bottom portion 256 of the T&H circuit of FIG. 2. Using like reference numbers for analogous components from FIG. 2, it can thus be seen-that the inputs of the amplifier 236 are directly connected to the capacitors $C_{1a}$ 228 and $C_{1b}$ 230, and the inputs of the amplifier 237 are directly connected to the capacitors $C_{2a}$ 249 and $C_{2b}$ 250. The switches Sa 402, Sb 404, Sc 406, and Sd 408, each clocked with S_clk_e 246, now have a dual role of determining the sampling instant of InP 202 and InN 204 onto their respective capacitors, and also resetting the inputs of the amplifiers 236, 237 to CMin 216. The inputs of the amplifiers 236, 237 are effectively shorted and held at voltage CMin 216 during sampling.

Figure 5:
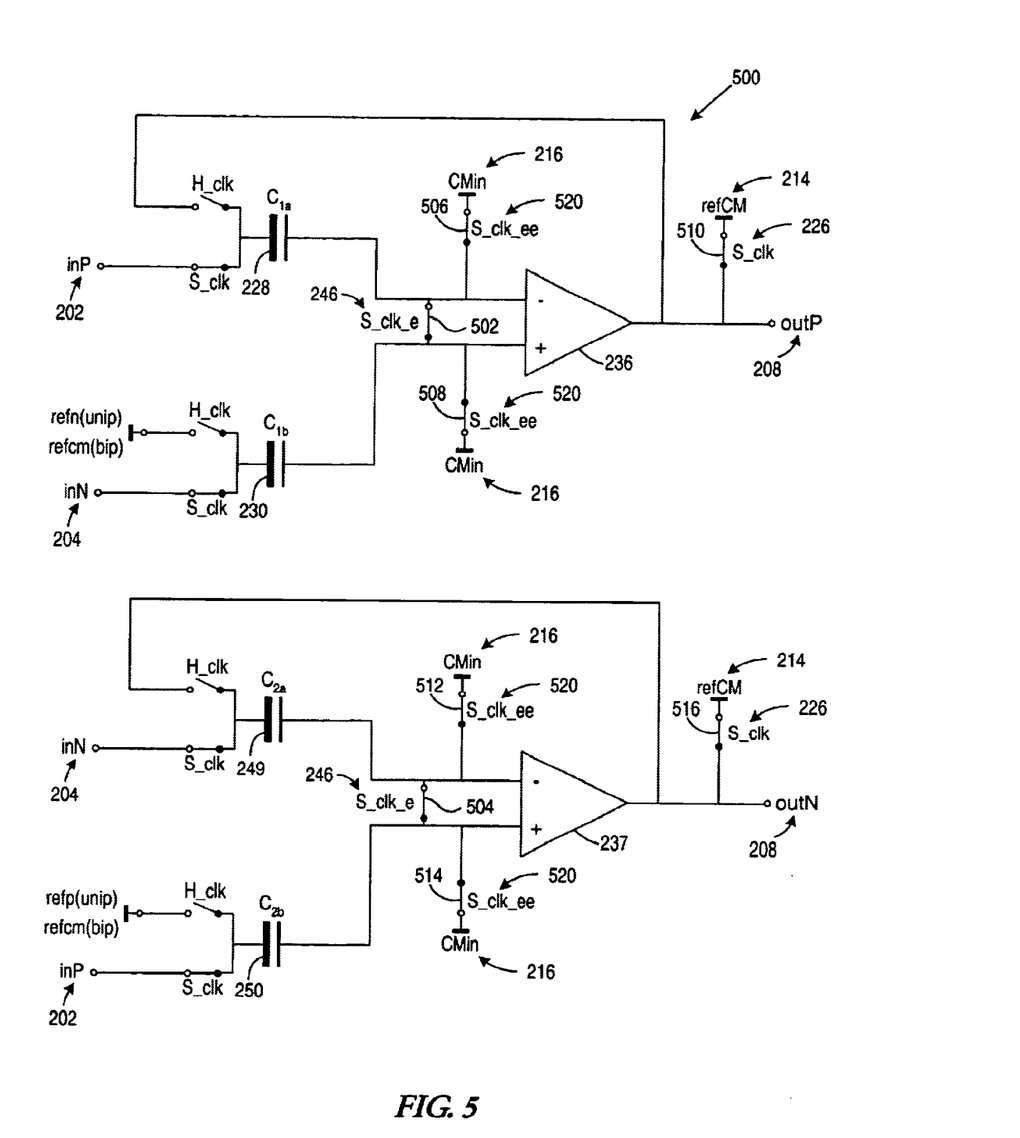

FIG. 5 is a diagram illustrating another embodiment of a track-and-hold circuit 500 in accordance with the principles of the present invention. The embodiment of FIG. 5 differs from that of FIG. 4 in that switches 502 and 504 have been added between the inputs of their respective amplifiers 236, 237. Each of these switches 502, 504 is clocked by the S_clk_e 246 signal. Further, switches 506, 508, 512, and 514 are clocked by an S_clk_ee 520 signal, while switches 510 and 516 are clocked by the S_clk 226 signal. The S_clk_e 246 signal represents a clock phase that opens the respective switches even earlier than S_clk_e 246. FIG. 3 illustrates an example of the S_clk_ee 520 signal, where the S_clk_ee 520 transitions to a low logic level prior to the S_clk 226 transitioning to a low logic level by a time $t_{ee}$. It should be recognized that FIG. 3 is not necessarily to scale with respect to time, as the times $t_e$ and $t_{ee}$ may be relatively small times, e.g., a couple inverter delays or more if desired. In this manner, switches 502, 504 purely determine the sampling moment and produce a sharp switch off with a very small switch, since the inputs of the amplifiers are no longer connected. In such an embodiment, the time constant of the switched capacitor sampling branch is minimized, being only the capacitor together with the large (small resistance) input switch plus half of the small switch 502, 504 as the case may be.

Figure 6:
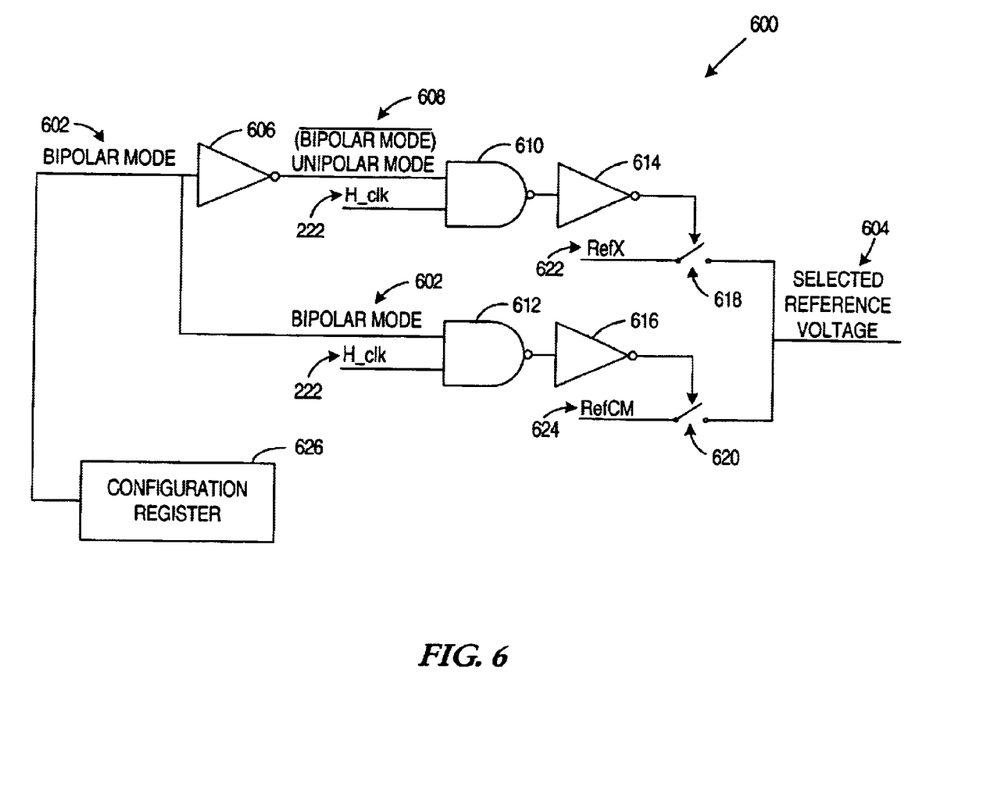
FIG. 6 illustrates an exemplary embodiment of a configurable switch circuit for selecting a desired reference voltage.

As previously indicated, the configuration switches S1 and S2, such as-those illustrated as switches 210, 212 in FIG. 2, determine the mode of operation. These "switches" represent switching "functions," as any number of switching implementations may be used. FIG. 6 illustrates one example of a switching implementation that may be used for such switching functions. It should be recognized that the example of FIG. 6 is provided for purposes of illustration only, as any number of analogous switching functions may be employed in accordance with the present invention.

Referring to FIG. 6, an exemplary embodiment of a configurable switch circuit 600 for selecting a desired reference voltage is illustrated. In this representative embodiment a control signal, labeled BIPOLAR MODE 602, identifies what the selected reference voltage 604 is to be. As previously indicated, this selection may be based on the type of input signal that is to be presented to the T&H circuit (e.g., unipolar, bipolar, differential, etc.). In this embodiment, the selection is shown between a unipolar input signal type and a bipolar input signal type. The control signal 602 is provided to an inverter 606, to also generate the complement of the BIPOLAR MODE signal, which is in essence a control signal representing the UNIPOLAR MODE 608, which is presented to an input of a logic circuit. While the logic circuitry can be any number of different arrangements, the illustrated embodiment shows that the UNIPOLAR MODE signal 608 is presented to a NAND gate 610. The BIPOLAR MODE 602 signal is also presented to a NAND gate 612. In each case, the H_clk 222 signal serves as the gating signal, such that on the high edge (for example) of the H_clk 222 signal one of the NAND gates will output a low logic level, which when inverted by its respective inverter 614, 616, provides a high logic level control signal to activate one of the parallel switches 618, 620. Depending on which of the switches 618, 620 is closed, the corresponding reference voltage 622, 624 will be switched in as the selected reference voltage 604.

In a more particular example, if the BIPOLAR MODE 602 signal is at a high logic level, NAND gate 612 will go low upon the H_clk 222 signal going high. This will cause a high logic level to be output from the inverter 616, which in turn causes switch 620 to close, and presents RefCM 624 as the selected reference voltage 604. In the case of a unipolar input signal type, the BIPOLAR MODE 602 signal will be at a low logic level, causing the UNIPOLAR MODE 608 signal to be high due to the inverter 606. The output of the NAND gate 610 will be low, causing a high logic level to be output from the inverter 614, which in turn causes switch 618 to close. This presents the RefX 622 signal (e.g., RefN, RefP, etc.) to be presented as the selected reference voltage 604. This parallel switching embodiment provides for a mutually exclusive selection of one of the available selectable reference voltages.

The BIPOLAR MODE control signal 602 may be generated in a number of ways. It may be directly presented via a hard-wired connection, or may be configurable. In one embodiment of the invention, the signal 602 is configurable, and is provided via a programmable configuration register 626. Such a programmable configuration register 626 may be configured at the time of initialization of the circuit, or may be dynamically modified at various stages of circuit operation. For example, a bit of the configuration register 626 may be programmed as a logic "1," which would be indicative of a bipolar input signal type since the BIPOLAR MODE control signal 602 would then be a logic high.

The foregoing description of various exemplary embodiments of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A track-and-hold circuit comprising:
   (a) a pair of circuits each receiving first and second input signals and providing half of a differential output signal, wherein the first and second input signals received by each respective circuit are reversed relative to each other, and wherein each circuit comprises:
      (i) an amplifier;
      (ii) a configurable switch circuit coupled to a selected one of a plurality of selectable reference voltages based on a predetermined input signal type;
      (iii) a first switched capacitor circuit to sample its respective first input signal relative to an external common mode voltage in response to a first clock phase, and to couple the sampled first input signal in a feedback configuration between an output and a negative input of the amplifier in response to a second clock phase; and
      (iv) a second switched capacitor circuit to sample its respective second input signal relative to the external common mode voltage in response to the first clock phase, and to couple the sampled second input signal to a positive input of the amplifier relative to the selected one of the selectable reference voltages in response to the second clock phase;
   (b) wherein the amplifiers of the circuit pair collectively provide the differential output signal as a differential version of the difference between the sampled first and second input signals as shifted by the selected one of the selectable reference voltages.

2. The track-and-hold circuit of claim 1, wherein the input signal type comprises a unipolar signal type wherein the first input signal is greater than or equal to the second input signal.

3. The track-and-hold circuit of claim 2, wherein the configurable switch circuit of a first circuit of the circuit pair is coupled to a selectable RefN reference voltage, and the configurable switch circuit of a second circuit of the circuit pair is coupled to a selectable RefP reference voltage, wherein RefP and RefN respectively correspond to upper and lower reference voltages of a circuit coupled to the track-and-hold circuit.

4. The track-and-hold circuit of claim 3, wherein the differential output signal is shifted between RefP and RefN.

5. The track-and-hold circuit of claim 1, wherein the input signal type comprises a bipolar signal type wherein the first input signal may be greater than or less than the second input signal.

6. The track-and-hold circuit of claim 5, wherein the configurable switch circuit of each of the circuits of the circuit pair is coupled to an internal common mode voltage, wherein the internal common mode voltage is defined as half of the sum of upper and lower reference voltages of a circuit coupled to the track-and-hold circuit.

7. The track-and-hold circuit of claim 6, wherein the internal common mode voltage is defined as (RefP+RefN)/2, wherein RefP and RefN respectively correspond to upper and lower reference voltages of a circuit coupled to the track-and-hold circuit.

8. The track-and-hold circuit of claim 7, wherein the differential output signal is shifted between RefP and RefN.

9. The track-and-hold circuit of claim 5, wherein the first and second input signals are independent from one another, and can range from approximately zero volts to RefP.

10. The track-and-hold circuit of claim 1, wherein the input signal type comprises a differential input signal.

11. The track-and-hold circuit of claim 10, wherein the configurable switch circuit of each of the circuits of the circuit pair is coupled to an internal common mode voltage, wherein the internal common mode voltage is defined as half of the sum of upper and lower reference voltages of a circuit coupled to the track-and-hold circuit.

12. The track-and-hold circuit of claim 1, wherein the external common mode voltage is defined as half a voltage swing of the differential output signal.

13. The track-and-hold circuit of claim 12, wherein the external common mode voltage is defined as (RefP−RefN)/2, wherein RefP and RefN respectively correspond to upper and lower reference voltages of a circuit coupled to the track-and-hold circuit.

14. The track-and-hold circuit of claim 1, further comprising a plurality of reset switches respectively coupled to each of the inputs and outputs of each amplifier, and operable to discharge at least some voltage remnants on the inputs and outputs of each amplifier during sampling by the first and second switched capacitor sampling circuits.

15. The track-and-hold circuit of claim 1, further comprising a programmable configuration register coupled to the configurable switch circuit to store a programmable value indicative of which of the plurality of selectable reference voltages is to be selected.

16. The track-and-hold circuit of claim 1, wherein:
(a) the first switched capacitor circuit of each circuit of the circuit pair comprises:
   (i) a capacitor;
   (ii) a first sampling switch coupled between the capacitor and its respective first input signal, and a second sampling switch coupled between the capacitor and the external common mode voltage, wherein the first and second sampling switches close in response to the first clock phase to sample the respective first input signal onto the capacitor relative to the external common mode voltage; and
   (iii) a first hold switch coupled between the output of the amplifier and the capacitor, and a second hold switch coupled between the capacitor and the negative input of the amplifier, wherein the first and second hold switches close in response to the second clock phase to provide the sampled first input signal to the negative input of the amplifier;
(b) and wherein the second switched capacitor circuit of each circuit of the circuit pair comprises:
   (i) a capacitor;
   (ii) a first sampling switch coupled between the capacitor and its respective first input signal, and a second sampling switch coupled between the capacitor and the external common mode voltage, wherein the first and second sampling switches close in response to the first clock phase to sample the respective first input signal onto the capacitor relative to the external common mode voltage; and
   (iii) a first hold switch coupled between the configurable switch circuit and the capacitor, and a second hold switch coupled between the capacitor and the positive input of the amplifier, wherein the first and second hold switches close in response to the second clock phase to provide the sampled first input signal to the positive input of the amplifier.

17. The track-and-hold circuit of claim 1, wherein:
(a) the first switched capacitor circuit of each circuit of the circuit pair comprises:
   (i) a capacitor;
   (ii) a sampling switch coupled between the capacitor and its respective first input signal, wherein the sampling switch closes in response to the first clock phase to sample the respective first input signal onto the capacitor relative to the external common mode voltage;
   (iii) a first hold switch coupled between the output of the amplifier and the capacitor, wherein the hold switch closes in response to the second clock phase to provide the sampled first input signal to the negative input of the amplifier;
(b) and wherein the second switched capacitor circuit of each circuit of the circuit pair comprises:
   (i) a capacitor;
   (ii) a sampling switch coupled between the capacitor and its respective first input signal, wherein the sampling switch closes in response to the first clock phase to sample the respective first input signal onto the capacitor relative to the external common mode voltage; and
   (iii) a hold switch coupled between the configurable switch circuit and the capacitor, wherein the hold switch closes in response to the second clock phase to provide the sampled first input signal to the positive input of the amplifier.

18. The track-and-hold circuit of claim 17, further comprising a pair of switches each coupled between the negative and positive inputs of its respective amplifier to short circuit the respective negative and positive inputs of its respective amplifier in response to the first clock phase to reduce a time constant during sampling.

19. The track-and-hold circuit of claim 1, wherein the amplifiers are single-ended amplifiers.

20. The track-and-hold circuit of claim 1, wherein the configurable switch circuit comprises:
a plurality of parallel switches each coupled to one of the plurality of selectable reference voltages;
a logic circuit coupled to each of the parallel switches to control each of the plurality of switches such that one of the plurality of switches is turned on in response to a signal indicating the expected input signal type.

21. The track-and-hold circuit of claim 20, wherein the logic circuit comprises a plurality of gating circuits, each coupled to control one of the plurality of switches, wherein each of the plurality of gating circuits receives one of a plurality of signals derived from the signal indicating the expected input signal type and outputs a switch control signal in response thereto.

22. A track-and-hold circuit, comprising:
(a) a first circuit comprising:
   (i) a first amplifier having an output to provide a first half of a differential output signal;
   (ii) first and second sampling circuits to respectively sample first and second input signals relative to an external common mode voltage in response to a first clock phase;
   (iii) a first switching circuit coupled to the first amplifier to provide the sampled first input signal to a negative input of the first amplifier;
   (iv) a first configurable switch circuit to select one of a plurality of selectable reference voltages based on an input signal type; and (v) a second switching circuit coupled between the first configurable switch circuit and the first amplifier to provide the sampled second input signal to a positive input of the first amplifier relative to the selected one of the selectable reference voltages in response to a second clock phase;

(b) a second circuit comprising:
  (i) a second amplifier having an output to provide a second half of the differential output signal;
  (ii) third and fourth sampling circuits to respectively sample the second and first input signals relative to the external common mode voltage in response to the first clock phase and contemporaneously with sampling by the first and second sampling circuits;
  (iii) a third switching circuit coupled to the second amplifier to provide the sampled second input signal to a negative input of the second amplifier;
  (iv) a second configurable switch circuit to select one of a plurality of selectable reference voltages based on the input signal type; and
  (v) a fourth switching circuit coupled between the second configurable switch circuit and the second amplifier to provide the sampled first input signal to a positive input of the second amplifier relative to the selected one of the selectable reference voltages in response to the second clock phase; and (c) wherein the first and second amplifiers collectively output the differential output signal as a differential version of the difference between the first and second input signals as offset by the selected one of the selectable reference voltages.

23. The track-and-hold circuit of claim 22, wherein the input signal type comprises a unipolar signal type wherein the first input signal is greater than or equal to the second input signal.

24. The track-and-hold circuit of claim 23, wherein the first configurable switch circuit is coupled to a selectable RefN reference voltage, and the second configurable switch circuit is coupled to a selectable RefP reference voltage, wherein RefP and RefN respectively correspond to upper and lower reference voltages of a circuit coupled to the track-and-hold circuit.

25. The track-and-hold circuit of claim 24, wherein the differential output signal is shifted between RefP and RefN.

26. The track-and-hold circuit of claim 22, wherein the input signal type comprises a bipolar signal type wherein the first input signal may be greater than or less than the second input signal.

27. The track-and-hold circuit of claim 26, wherein the first and second configurable switch circuits are coupled to an internal common mode voltage, wherein the internal common mode voltage is defined as half of the sum of upper and lower reference voltages of a circuit coupled to the track-and-hold circuit.

28. The track-and-hold circuit of claim 27, wherein the internal common mode voltage is defined as (RefP+RefN)/2, wherein RefP and RefN respectively correspond to upper and lower reference voltages of a circuit coupled to the track-and-hold circuit.

29. The track-and-hold circuit of claim 28, wherein the differential output signal is shifted between RefP and RefN.

30. The track-and-hold circuit of claim 22, wherein the input signal type comprises a differential input signal.

31. The track-and-hold circuit of claim 30, wherein the first and second configurable switch circuits are coupled to an internal common mode voltage, wherein the internal common mode voltage is defined as half of the sum of upper and lower reference voltages of a circuit coupled to the track-and-hold circuit.

32. The track-and-hold circuit of claim 22, further comprising at least one programmable configuration register coupled to the first and second configurable switch circuits to store a programmable value indicative of which of the plurality of selectable reference voltages is to be selected.

33. The track-and-hold circuit of claim 22, wherein the track-and-hold circuit comprises a double sampling track-and-hold circuit, wherein:

(a) the first circuit further comprises:
  (i) fifth and sixth sampling circuits to respectively sample the first and second input signals relative to an external common mode voltage in response to the second clock phase;
  (ii) a fifth switching circuit coupled to the, first amplifier to provide the sampled first input signal to the negative input of the first amplifier;
  (iii) a third configurable switch circuit to select one of the plurality of selectable reference voltages based on an input signal type; and
  (iv) a sixth switching circuit coupled between the third configurable switch circuit and the first amplifier to provide the sampled second input signal to a positive input of the first amplifier relative to the selected one of the selectable reference voltages in response to the first clock phase;

(b) the second circuit further comprises:
  (i) seventh and eighth sampling circuits to respectively sample the second and first input signals relative to the external common mode voltage in response to the second clock phase;
  (ii) a seventh switching circuit coupled to the second amplifier to provide the sampled second input signal to the negative input of the second amplifier;
  (iii) a fourth configurable switch circuit to select one of the plurality of selectable reference voltages based on the input signal type; and
  (iv) an eighth switching circuit coupled between the fourth configurable switch circuit and the second amplifier to provide the sampled first input signal to a positive input of the second amplifier relative to the selected one of the selectable reference voltages in response to the first clock phase.

* * * * *